(12) United States Patent
Aga et al.

(10) Patent No.: US 6,884,696 B2
(45) Date of Patent: Apr. 26, 2005

(54) METHOD FOR PRODUCING BONDING WAFER

(75) Inventors: Hiroji Aga, Gunma (JP); Shinichi Tomizawa, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/380,979

(22) PCT Filed: Jul. 9, 2002

(86) PCT No.: PCT/JP02/06965

§ 371 (c)(1),
(2), (4) Date: Mar. 20, 2003

(87) PCT Pub. No.: WO03/009386

PCT Pub. Date: Jan. 30, 2003

(65) Prior Publication Data

US 2003/0181001 A1 Sep. 25, 2003

(30) Foreign Application Priority Data

Jul. 17, 2001 (JP) ........................................ 2001-216828

(51) Int. Cl.[7] .......................... H01L 21/30; H01L 21/46
(52) U.S. Cl. ........................................ 438/459; 438/977
(58) Field of Search ............................... 438/459, 458, 438/455, 475, 502, 506, 509, 513, 663, 692, 770, 311, 906, 977, 406

(56) References Cited

U.S. PATENT DOCUMENTS

| | | | |
|---|---|---|---|
| 5,920,764 A | * | 7/1999 | Hanson et al. .................. 438/4 |
| 6,103,599 A | | 8/2000 | Henley et al. |
| 6,596,610 B1 | * | 7/2003 | Kuwabara et al. .......... 438/458 |

FOREIGN PATENT DOCUMENTS

| | | |
|---|---|---|
| JP | 05-211128 | 8/1993 |
| JP | 10-074922 | 3/1998 |
| JP | 10-242154 | 9/1998 |
| JP | 10-326790 | 12/1998 |
| JP | 11-354761 | 12/1999 |
| JP | 2000-124092 | 4/2000 |
| TW | 406426 | 9/2000 |
| WO | WO 01/28000 | 4/2001 |

\* cited by examiner

*Primary Examiner*—David Nhu
(74) *Attorney, Agent, or Firm*—Hogan & Hartson, LLP

(57) ABSTRACT

A method for producing a bonded wafer by the ion implantation delamination method includes at least a step of bonding a bond wafer having a micro bubble layer formed by gaseous ion implantation and a base wafer serving as a support substrate and a step of delaminating the bond wafer at the micro bubble layer as a border to form a thin film on the base wafer. After the delamination of the bond wafer, the bonded wafer is subjected to a heat treatment in an atmosphere of an inert gas, hydrogen or a mixed gas thereof, then the bonded wafer is subjected to thermal oxidation to form a thermal oxide film on the surface of the thin film, and then the thermal oxide film is removed to reduce thickness of the thin film.

17 Claims, 1 Drawing Sheet

METHOD FOR PRODUCING BONDING WAFER

TECHNICAL FIELD

The present invention relates to a method for producing a bonded wafer utilizing the ion implantation delamination method, in particular, a method for producing an SOI wafer by bonding a silicon wafer implanted with hydrogen ions or the like to another wafer serving as a support substrate and then delaminating the wafer.

BACKGROUND ART

Recently, as a method for producing an SOI wafer, the method comprising bonding a wafer implanted with hydrogen ions or the like and then delaminating the wafer to produce an SOI wafer (a technique called ion implantation delamination method: Smart Cut Method (registered trademark)) is newly coming to attract much attention. This method is a technique for producing an SOI wafer, wherein an oxide film is formed on at least one of two silicon wafers, gaseous ions such as hydrogen ions or rare gas ions are implanted into one wafer (bond wafer) from its top surface to form a micro bubble layer (enclosed layer) in this silicon wafer, then the ion-implanted surface of the wafer is bonded to the other silicon wafer (base wafer) via the oxide film, thereafter the wafers were subjected to a heat treatment (delamination heat treatment) to delaminate one of the wafers (bond wafer) as a thin film at the micro bubble layer as a cleavage plane, and the bonded wafer is further subjected to a heat treatment (bonding heat treatment) for firm bonding to obtain an SOI wafer (refer to Japanese Patent Laid-open (Kokai) Publication No. 5-211128). In this method, the cleavage plane (delaminated plane) is obtained as a good mirror surface, and an SOI wafer also having high uniformity of the thickness of the SOI layer is comparatively easily obtained.

However, when an SOI wafer is produced by the ion implantation delamination method, a damaged layer remains on the surface of SOI wafer after delamination due to the ion implantation, and the surface has higher surface roughness compared with mirror surfaces of silicon wafers of usual product level. Therefore, it becomes necessary to remove such a damaged layer and roughening of the surface in the ion implantation delamination method. Conventionally, in order to remove the damaged layer and so forth, mirror polishing using a small amount of stock removal for polishing (stock removal: about 100 nm), which is called touch polish, has been performed in a final step after the bonding heat treatment.

However, if the SOI layer is subjected to polishing involving a mechanical processing factor, there is caused a problem that uniformity of the SOI layer thickness attained by implantation of hydrogen ions or the like and the delamination is degraded, because the stock removal for polishing is not uniform.

Therefore, Japanese Patent Laid-open (Kokai) Publication No. 10-242154 proposed a method for improving the surface roughness by subjecting an SOI wafer obtained by the ion implantation delamination method to a heat treatment in an active atmosphere (hydrogen atmosphere) without polishing the surface of the SOI wafer. It is described that, according to this method, the surface roughness of the SOI layer surface can be improved while maintaining the uniformity of film thickness of the SOI layer.

However, damages resulting from the ion implantation exist in an SOI wafer obtained by the ion implantation delamination method, and the damages in the SOI layer are large at the surface side and become smaller at a deeper position in the layer. Therefore, if the wafer is subjected to such a heat treatment in an active atmosphere as described above, recovery of the damages advances from interior of the SOI layer to the surface side. However, when the damages at the surface side are large, a heat treatment at a high temperature for a long period of time is required, and in addition, complete recovery may not be obtained even if a heat treatment is performed at a high temperature for a long period of time, as the case may be.

Since the strength and depth of the damages are influenced by the amount of implantation energy and dose of gaseous ions such as hydrogen ions, for example, when the implantation energy needs to be increased as in the case of producing an SOI wafer having a thick SOI layer or a thick buried oxide layer, or when the dose needs to be increased for the purpose of performing the delamination heat treatment at a low temperature, the aforementioned problem becomes remarkable.

Furthermore, if the wafer is subjected to a heat treatment at a high temperature for a long period of time under a reducing atmosphere comprising hydrogen gas, silicon at the SOI layer surface may be etched, thus thickness uniformity may be degraded, and etch pits may be formed in a buried oxide layer. This phenomenon is caused by the reason described below. That is, defects such as COPs (Crystal Originated Particles) exist in the SOI layer, and if they are connected to the oxide film as the under layer, COPs do not disappear and remain as they are, or they are even enlarged. Therefore, hydrogen or the like that penetrates through the defects also etches the buried oxide layer, and thus pits are formed there to cause the aforementioned phenomenon. These etch pits are problematic, since they influence also on the SOI layer neighboring the pits.

As described above, although various methods have been proposed in order to remove the damaged layer and roughening of the surface of SOI wafer obtained by the ion implantation delamination method while maintaining the thickness uniformity of SOI layer, there are no satisfactory method so far, and a suitable solution method has been desired.

Therefore, as described in Japanese Patent Laid-open (Kokai) Publication No. 2000-124092, the applicants of the present invention proposed, as a method for producing an SOI wafer of high quality by removing the damaged layer and the roughening of the surface remaining on a surface of SOI layer after the delamination in the ion implantation delamination method while maintaining the thickness uniformity of the SOI layer, a method of forming an oxide film by a heat treatment under an oxidizing atmosphere on the SOI surface after delamination, then removing the oxide film, and subsequently subjecting the wafer to a heat treatment under a reducing atmosphere.

If the so-called sacrificial oxidation is performed, in which an oxide film is formed on the SOI layer by a heat treatment under an oxidizing atmosphere, and then the oxide film is removed, a part of or whole damaged layer on the SOI layer surface can be incorporated into the oxide film, and therefore the damaged layer can efficiently be removed by removing the oxide film. Further, a heat treatment can be subsequently performed under a reducing atmosphere to recover the damaged layer remaining in the SOI layer and improve the surface roughness, and the heat treatment time of the heat treatment under a reducing atmosphere can also be shortened, since a part of or whole damaged layer on the SOI layer surface has been removed by the sacrificial oxidation. Furthermore, this method does not require polishing or the like involving a mechanical processing factor, uniformity of the film thickness of the SOI layer is not degraded, and thus it is considered that an SOI wafer of extremely high quality can be produced by the ion implantation delamination method with higher productivity.

As described above, the technique described in Japanese Patent Publication (Kokai) Laid-open No. 2000-124092 has the advantage that the damaged layer and the roughening of the surface remaining on the SOI layer surface after the delamination can be removed in the ion implantation delamination method while maintaining the thickness uniformity of the SOI layer. However, when the inventors of the present invention performed additional experiments for this technique, it was found that the technique had the following drawbacks and thus the technique was insufficient as it was as a method for production in a large scale.

1) Since the sacrificial oxidation in the aforementioned technique directly oxidizes the delaminated plane obtained by the ion implantation, oxidation induced stacking faults (OSFs) may be generated by the oxidation, and these OSFs may not be completely removed only by the subsequent heat treatment under a reducing atmosphere.
2) Surface roughness sufficiently removed by the heat treatment under a reducing atmosphere mainly consists only of short period components (e.g., period of 1 $\mu$m or less), and removal of long period components (e.g., period of about 1 to 10 $\mu$m) of the surface roughness may become insufficient.
3) If the high temperature heat treatment is performed under an atmosphere containing a large amount of hydrogen gas as the reducing atmosphere, the hydrogen gas acts on the bonding interface, and thus corrosion of the interface may become significant and thus it may cause particle generation in the device production process.

DISCLOSURE OF THE INVENTION

The present invention was accomplished in order to solve the aforementioned problems, and its object is to provide a method for producing a bonded wafer, which can surely remove damages or defects on a surface of a wafer produced by the ion implantation delamination method and sufficiently flatten the surface roughness while maintaining the thickness uniformity of the bonded wafer, and which can also be sufficiently used as a technique for large scale production.

In order to achieve the aforementioned object, the present invention provides a method for producing a bonded wafer by the ion implantation delamination method comprising at least a step of bonding a bond wafer having a micro bubble layer formed by gaseous ion implantation and a base wafer serving as a support substrate and a step of delaminating the bond wafer at the micro bubble layer as a border to form a thin film on the base wafer, wherein, after the delamination of the bond wafer, the bonded wafer is subjected to a heat treatment in an atmosphere of an inert gas, hydrogen or a mixed gas thereof, then the bonded wafer is subjected to thermal oxidation to form a thermal oxide film on the surface of the thin film, and then the thermal oxide film is removed to reduce thickness of the thin film.

If the delaminated plane of the thin film after the delamination step is subjected to a heat treatment under an atmosphere of an inert gas, hydrogen gas or a mixed gas thereof to perform a surface flattening treatment and removal of damages, and then the oxidation and the removal of the oxide film are performed as described above, uniformity of the film thickness can be maintained, and generation of OSFs due to the oxidation can also surely be avoided.

In the aforementioned method, after the heat treatment under an atmosphere of an inert gas, hydrogen gas or a mixed gas thereof, the surface of the thin film can be polished for a stock removal of 70 nm or less, and then the thermal oxidation can be performed.

If the surface is slightly polished (stock removal of 70 nm or less, especially 50 nm or less) after the heat treatment under an atmosphere of an inert gas, hydrogen gas or a mixed gas thereof, the long period components of surface roughness can be improved.

That is, although the short period components of surface roughness are fully removed by the heat treatment under an atmosphere of an inert gas, hydrogen gas or a mixed gas thereof, long period components may remain, and therefore they are removed by polishing. If the heat treatment is once performed as described above, the surface roughness and damages of the surface are improved, and therefore the stock removal for polishing can be reduced compared with that conventionally used, and in particular, it may be reduced to a half or less of the conventionally used stock removal. Thus, the long period components of surface roughness can surely be removed while the influence on uniformity of film thickness is minimized.

Further, the heat treatment under an atmosphere of an inert gas, hydrogen gas or a mixed gas thereof is preferably performed under a 100% argon atmosphere or an argon atmosphere containing hydrogen in an amount below explosion limit.

Such an atmosphere enables improvement of surface roughness and damages of the surface while suppressing corrosion of the bonding interface.

Further, in the present invention, a silicon single crystal wafer is preferably used as the bond wafer.

If a silicon single crystal wafer, which enables production of wafers having high quality and large diameter, is used as the bond wafer, gaseous ions are implanted into it, and it is delaminated, a bonded wafer having a silicon single crystal thin film of high quality and a large diameter can be produced at a low cost.

Moreover, the bonded wafer produced by the method of the present invention can be a bonded wafer having a thin film of high quality showing high uniformity of film thickness and being free from roughening of the surface and surface damages.

For example, there can be provided a bonded SOI wafer produced by bonding two of silicon wafers via an oxide film, wherein surface roughness (RMS) measured for a 1 $\mu$m square and 10 $\mu$m square of the SOI layer surface is 0.15 nm or less for the both squares, and $\sigma$ of the thickness of the SOI layer is 1.5 nm or less.

As explained above, according to the present invention, the damaged layer and surface roughness remaining on the surface of the delaminated thin film in the ion implantation delamination method can surely be removed while maintaining the uniformity of film thickness of the thin film. Therefore, a bonded wafer of extremely high quality can be produced with high productivity, and thus it is a method for producing a bonded wafer extremely suitable as a technique for large scale production.

BEST MODE FOR CARRYING OUT THE INVENTION

Figure 1:
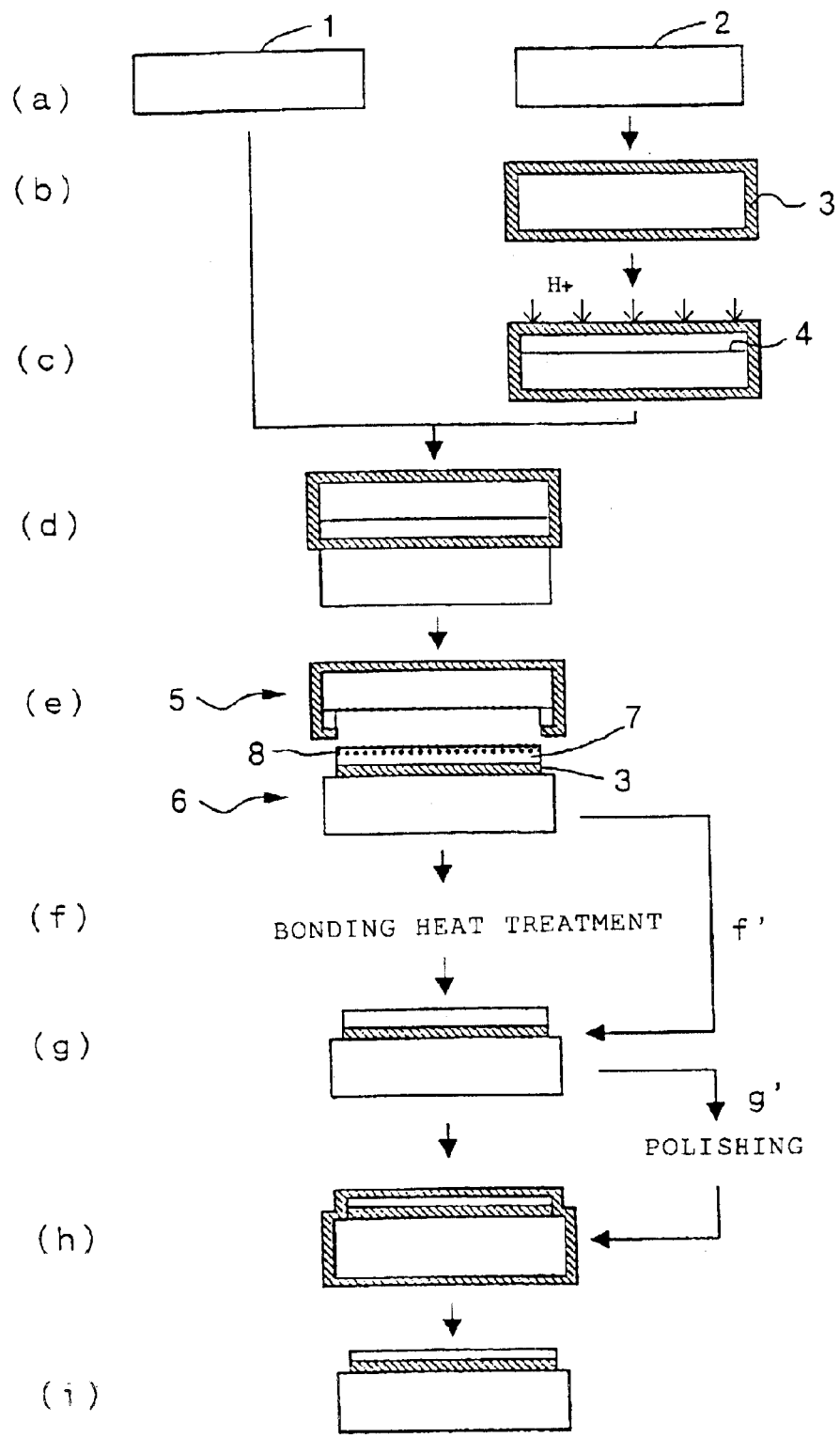
FIGS. 1(a) to 1(i) show a flow diagram of an exemplary process for producing an SOI wafer by the ion implantation delamination method according to the present invention.

Hereafter, embodiments of the present invention will be explained with reference to the appended drawings. However, the present invention is not limited to these.

FIG. 1 shows a flow diagram of an exemplary process for producing an SOI wafer by the ion implantation delamination method according to the present invention.

The present invention will be explained hereafter by exemplifying a case where two of silicon wafers are bonded.

In the ion implantation delamination method shown in FIG. 1, two mirror-surface silicon wafers are prepared first in the step (a). That is, a base wafer 1 that serves as a support substrate and a bond wafer 2 from which an SOI layer is obtained, which correspond to specifications of devices, are prepared.

Then, in the step (b), at least one of the wafers, the bond wafer 2 in this case, is subjected to thermal oxidation to form an oxide film 3 having a thickness of about 0.1 to 2.0 $\mu$m on its surface.

In the step (c), gaseous ions such as hydrogen ions or rare gas ions, hydrogen ions in this case, are implanted into one surface of the bond wafer 2 on which the oxide film was formed to form a micro bubble layer (enclosed layer) 4 parallel to the surface in mean penetrating depth of the ions.

The step (d) is a step of superimposing the base wafer 1 on the hydrogen ion implanted surface of the hydrogen ion implanted bond wafer 2 via an oxide film and bonding them. Usually, by contacting the surfaces of two of the wafers to each other in a clean atmosphere at an ordinary temperature, the wafers are adhered to each other without using an adhesive or the like.

The subsequent step (e) is a delamination heat treatment step in which the wafers were delaminated at the enclosed layer 4 as a border to separate them into a delaminated wafer 5 and an SOI wafer 6 (SOI layer 7+buried oxide layer 3+base wafer 1). For example, if the wafers are subjected to a heat treatment at a temperature of about 400° C. to 600° C. under an inert gas atmosphere, the wafers are separated into the delaminated wafer 5 and the SOI wafer 6 due to rearrangement of crystals and aggregation of bubbles in the enclosed layer. On the SOI layer 7 at the surface of the SOI wafer as it is after the delamination, a damaged layer 8 remains.

Further, ions to be implanted such as hydrogen ions can be excited and implanted in a state of plasma, or bonding surfaces can be preliminarily subjected to a treatment with nitrogen, oxygen, hydrogen plasma or the like so as to be activated and bonded, as the result the delamination heat treatment can be omitted.

After this delamination step, the bonding heat treatment is performed in the step (f). In this step, the SOI wafer 6 is subjected to a heat treatment at a high temperature as a bonding heat treatment to obtain sufficient bonding strength, since the bonding strength of the wafers brought into close contact in the aforementioned bonding step and the delamination heat treatment step in the steps (d) and (e) as it is would be weak for use in the device production process. This heat treatment is preferably performed, for example, under an atmosphere of inert gas at 1000° C. to 1300° C. for 30 minutes to 2 hours. As for the steps thus far, the method of the present invention is the same as the conventional ion implantation delamination method.

However, in the method of the present invention, this bonding heat treatment may be omitted, and the heat treatment in the following step under an atmosphere of an inert gas, hydrogen gas or a mixed gas thereof can be used also as the bonding heat treatment (refer to FIG. 1, f'). Thus, the steps can be further simplified compared with the conventional method of removing the roughening of the surface or surface damages.

Then, in the step (g), the SOI wafer after the bonding heat treatment step (f) (or after the delamination step (e) when the bonding heat treatment is omitted) is subjected to a heat treatment under an inert gas, hydrogen gas or a mixed gas thereof using a usual heat treatment furnace in which heating is attained by a heater (batch furnace) to improve surface roughness and remove damages on the SOI surface. The heat treatment temperature is suitably 1100° C. to 1350° C. When it is lower than 1100° C., a long period of time is required to improve the surface roughness. On the other hand, a temperature exceeding 1350° C. may cause a problem concerning contamination with heavy metal impurities or durability of the heat treatment furnace. Further, although the heat treatment time depends also on the heat treatment temperature, it is suitably in the range of 10 minutes to 8 hours. The heat treatment for a period shorter than that may provide insufficient improvement of the surface roughness, and the heat treatment for a period longer than that decreases the productivity. When the aforementioned heat treatment is performed by using an RTA (Rapid Thermal Annealing) apparatus, the heat treatment temperature is preferably 1200° C. or higher, and the heat treatment time is preferably 1 to 120 seconds. Moreover, these heat treatment using a batch furnace and heat treatment using an RTA apparatus can also be performed in combination.

The heat treatment atmosphere may consist of an inert gas, hydrogen gas or a mixed gas thereof. However, if the content of hydrogen gas is high, the aforementioned corrosion of the bonding interface becomes likely to be generated, and slip dislocations become likely to be generated by the heat treatment. Therefore, the hydrogen gas content is preferably 25% or less. The hydrogen gas content is more preferably, lower than the explosion limit (4%) in view of safety. Although argon gas, which is most inexpensive and shows high versatility, is suitable as the inert gas, helium or the like may also be used.

As described above, in the present invention, a sacrificial oxide film is not directly formed on the delaminated plane, but the surface roughness and the damages of the surface are improved by first performing the heat treatment of the step (g) without generating OSFs in the thin film and without degrading the thickness uniformity.

Then, since damages on the SOI surface cannot be sufficiently removed only by the heat treatment of the step (g) in many cases, damages on the SOI surface are taken into an oxide film by the thermal oxidation in the step (h), and thickness of the thermal oxide film to be formed is controlled at the same time so that thickness of the obtained SOI layer should become a desired thickness. If the thickness of the SOI layer is reduced by the thermal oxidation, a thinner film can be obtained substantially without degrading thickness uniformity.

Further, if the thermal oxide film is removed by using, for example, an aqueous solution containing HF in the step (i), an SOI wafer having an SOI layer of the desired thickness is formed.

Thus, an SOI wafer having an SOI layer with a desired thickness can be obtained, in which the roughening of the surface and damages of the surface are surely removed while thickness uniformity is maintained In addition, after the heat treatment in the step (g) and before the thermal oxidation step (h), a polishing step using a stock removal of 70 nm or less, especially 50 nm or less, may be added as required (refer to FIG. 1, g'). By adding this polishing step, long period components of the surface roughness, which cannot be removed by the heat treatment of the step (g), can be surely removed. Further, since the stock removal is limited to 70 nm or less, especially 50 nm or less, it is smaller than the stock removal conventionally used (about 100 nm or more), and it can be reduced to, for example, a half or less of the conventionally used stock removal. Thus, degradation of thickness uniformity of the SOI layer can be markedly suppressed.

Hereafter, explanations will be specifically made with reference to examples of the present invention and comparative examples. However, the present invention is not limited to these.

EXAMPLES 1 TO 4 AND COMPARATIVE EXAMPLES 1 TO 3

A silicon single crystal ingot produced by the Czochralski method and having a crystal orientation of <100>, conductivity type of p-type and a resistivity of 20 Ω·cm was sliced and processed to prepare mirror surface silicon wafers having a diameter of 200 mm. These were divided into bond wafers and base wafers, and SOI wafers were produced by the ion implantation delamination method of the present invention according to the steps represented in FIGS. 1, (a) to (i).

First, according to FIGS. 1(a) to (e), a bond wafer 2 was delaminated to obtain an SOI wafer 6. At this time, thickness of a buried oxide layer 3 was 400 nm, and the other major conditions such as those for ion implantation were as follows.

1) Ion implantation conditions: H$^+$ ions, implantation energy: 90 keV, implantation dose: $6.5 \times 10^{16}$/cm$^2$
2) Delamination heat treatment conditions: under N$_2$ gas atmosphere, 500° C., 30 minutes Thus, the SOI wafer 6 having an SOI layer 7 with a thickness of 437 nm could be obtained. When surface roughness of the surface (delaminated surface) of the SOI wafer 6 as delaminated shown in FIG. 1(e) was measured for a 1 μm square by the atomic force microscope method, it was found to be 6.7 nm in average in terms of the RMS value (root-mean-square roughness value). This value is 10 times or more of a value for surface roughness of usual mirror-polished silicon single crystal wafers, and it can be seen that the surface of the SOI layer as delaminated has significant local roughening of the surface (short period components). Moreover, the RMS value for a 10 μm square, which serves as an index of long period components, was also large, i.e., as large as 5.5 nm in average.

Each SOI wafer immediately after the delamination steps (e) was used and processed according to the processing flows shown in Tables 1 and 2. Surface roughness (RMS), thickness uniformity (average: t, standard deviation: σ) and defect density of the SOI layer of each obtained bonded wafer were measured. Treatment conditions and measurement conditions are shown in Table 3.

TABLE 1

| | Example 1 | Example 2 | Comparative Example 1 | Comparative Example 2 |
|---|---|---|---|---|
| Processing flow | No bonding heat treatment ↓ Ar annealing ↓ Sacrificial oxidation ↓ Removal of oxide film | Bonding heat treatment ↓ Ar annealing ↓ Polishing for 40 nm ↓ Sacrificial oxidation ↓ Removal of oxide film | No bonding heat treatment ↓ Ar annealing | Bonding heat treatment ↓ Sacrificial oxidation ↓ Removal of oxide film ↓ Ar annealing |

TABLE 2

| | Example 3 | Example 4 | Comparative Example 3 |
|---|---|---|---|
| Processing flow | Bonding heat treatment ↓ Ar annealing ↓ Polishing for 55 nm ↓ Sacrificial oxidation ↓ Removal of oxide film | Bonding heat treatment ↓ Ar annealing ↓ Polishing for 70 nm ↓ Sacrificial oxidation ↓ Removal of oxide film | Bonding heat treatment ↓ Polishing for 100 nm |

TABLE 3

Treatment conditions and measurement conditions (Bonding heat treatment)

1100° C., 120 minutes (100% N$_2$ atmosphere)
(Ar annealing)

1200° C., 60 minutes (100% Ar atmosphere)
(Sacrificial oxidation)

950° C., pyrogenic oxidation, oxide film thickness: 590 nm (Example 1), 500 nm (Example 2), 465 nm (Example 3), 435 nm (Example 4), 590 nm (Comparative Example 2)
(Removal of oxide film)

Etching with 5% hydrofluoric acid
(Surface roughness measurement)

AFM produced by Veeco, RMS measurement for 1 μm square and 10 μm square
(Thickness distribution measurement)

AcuMap 2 produced by ADE, measured for 1765 points in a plane
(Defect measurement)

Diluted Secco etching until SOI layer thickness becomes 30 nm → Etching with hydrofluoric acid → Observation with optical microscope Hereafter, the defect measurement method for the SOI layer will be explained briefly.

In a case of thin film SOI as in the present invention, if the Secco etching solution (mixture of dichromic acid, hydrofluoric acid and water), which is used for the preferential etching of usual silicon wafers, is used, the etching rate becomes unduly high, and the SOI layer is removed by the etching for a short period of time. Therefore, it is not suitable for evaluation of defects.

Therefore, the etching is performed by using the Secco etching solution diluted with pure water so as to reduce the etching rate until the thickness of the SOI layer becomes a predetermined thickness. By this etching, defect portions in the SOI layer become micro pits penetrating the SOI layer. Since it is difficult to observe these micro pits as they are, the buried oxide layer is etched through the micro pits by immersing the wafer in hydrofluoric acid to visualize the defect portions. Thus, the defect portions can be easily observed from the surface of the thin film SOI layer by using a optical microscope.

In these examples and comparative examples, a commercially available usual Secco etching solution was diluted twice and used, and the diluted Secco etching was terminated when the thickness of the remaining SOI layer became about 30 nm. Then, the wafer was immersed in 25 weight % hydrofluoric acid for 90 seconds, and defect density was measured by observing the pits formed in the buried oxide layer by using a optical microscope of 100 magnifications.

The measurement results are shown in Tables 4 and 5.

TABLE 4

| | RMS (nm) | | Thickness distribution (nm) | | Defect density (number/cm$^2$) |
|---|---|---|---|---|---|
| | 1 μm square | 10 μm square | Average t | σ | |
| Example 1 | 0.08 | 0.29 | 171.5 | 0.2 | $1 \times 10^2$ |
| Example 2 | 0.06 | 0.16 | 172.4 | 1.0 | $1 \times 10^2$ |
| Comparative Example 1 | 0.10 | 0.28 | 437.0 | 0.2 | $5 \times 10^5$ |
| Comparative Example 2 | 0.11 | 0.30 | 171.5 | 0.2 | $2 \times 10^4$ |

TABLE 5

| | RMS (nm) | | Thickness distribution (nm) | | Defect density (number/cm$^2$) |
|---|---|---|---|---|---|
| | 1 μm square | 10 μm square | Average t | σ | |
| Example 3 | 0.08 | 0.15 | 172.5 | 1.4 | $1 \times 10^2$ |
| Example 4 | 0.09 | 0.14 | 171.5 | 1.5 | $1 \times 10^2$ |
| Comparative Example 3 | 0.10 | 0.13 | 437.0 | 2.0 | $5 \times 10^5$ |

From the results shown in Tables 4 and 5, it can be seen that, for sufficiently removing roughening of the surface and damages on the surface resulting from ion implantation and forming an SOI layer having few defects, the production method of the present invention used for Examples 1 to 4 is suitable. Moreover, in Example 1, removal of a delaminated surface by polishing is not performed at all, and therefore extremely superior thickness uniformity was obtained. Long period components of the surface roughness was improved by 10 times or more compared with those immediately after the delamination, although they are slightly inferior compared with Examples 2 to 4 where polishing was performed for 70 nm or less. Moreover, in Examples 2 to 4, although a little degradation of the thickness uniformity was observed due to the influence of polishing, σ was still maintained at a high level of 1.0 to 1.5 nm. Furthermore, extremely high quality was obtained for surface roughness for both of the short period components and long period components.

On the other hand, it can be seen that, if the Ar annealing alone was used as in Comparative Example 1, the defect density becomes markedly high, and surface damages cannot be completely removed. Further, it can be seen that, as in Comparative Example 2, although the effect of defect reduction was obtained by performing the sacrificial oxidation before the Ar annealing, the defect density became higher compared with Examples 1 to 4 due to the generation of OSFs in the oxidation step. Moreover, if the polishing alone was used as in Comparative Example 3, the defect density became markedly high, and in addition, the thickness uniformity was bad because the polishing was performed for no less than 100 nm.

Thus, it can be seen that, according to the present invention, there can be produced, for example, a bonded SOI wherein surface roughness (RMS) measured for a 1 μm square and 10 μm square of the SOI layer surface is 0.15 nm or less for the both squares, σ of the thickness of the SOI layer is 1.5 nm or less, and moreover defect density is less than $10^3$ number/cm$^2$.

Furthermore, although 100% Ar atmosphere was used as the atmosphere for the heat treatment for improving the surface roughness in the aforementioned examples, when the experiments were performed by using an argon atmosphere containing 3% hydrogen gas instead of the above atmosphere, results substantially similar to those mentioned above were obtained. Further, in the heat treatment under 100% Ar atmosphere in Examples 1 to 4 and the heat treatment utilizing the argon atmosphere containing 3% hydrogen gas instead of that, such corrosion of the bonding interface as seen in a heat treatment under an atmosphere containing a large amount of hydrogen such as 100% hydrogen atmosphere was not observed.

The present invention is not limited to the embodiments described above. The above-described embodiments are mere examples, and those having the substantially same configuration as that described in the appended claims and providing the similar functions and advantages are included in the scope of the present invention.

For example, while the present invention was explained above mainly for the cases of bonding two of silicon wafers to produce SOI wafers, the present invention is not limited to those, and of course it can also be applied to a case where an ion-implanted silicon wafer is bonded to an insulator wafer and delaminated to produce an SOI wafer, and a case where a compound semiconductor wafer such as GaAs wafer is used as a wafer to be implanted with ions.

Further, the production steps for producing the bonded wafer according to the present invention are not limited to those mentioned in FIG. 1. Other steps such as cleaning and heat treatment may be added, and the steps are used with suitable modification including alteration of the order of the steps, omission of some steps and so forth depending on the purpose.

What is claimed is:

1. A method for producing a bonded wafer by an ion implantation delamination method comprising at least a step of bonding a bond wafer having a micro bubble layer formed by gaseous ion implantation and a base wafer serving as a support substrate and a step of delaminating the bond wafer at the micro bubble layer as a border to form a thin film on the base wafer, wherein, after delaminating the bond wafer, the bonded wafer is subjected to a heat treatment in an atmosphere of an inert gas, hydrogen or a mixed gas thereof, then the bonded wafer is subjected to thermal oxidation to form a thermal oxide film on a surface of the thin film, and then the thermal oxide film is removed to reduce thickness of the thin film.

2. The method for producing a bonded wafer according to claim 1, wherein, after the heat treatment in an atmosphere of an inert gas, hydrogen or a mixed gas thereof, the surface of the thin film is polished for a stock removal of 70 nm or less, and then the thermal oxidation is performed.

3. The method for producing a bonded wafer according to claim 1, wherein the heat treatment in an atmosphere of an inert gas, hydrogen or a mixed gas thereof is performed in a 100% argon atmosphere or an argon atmosphere containing hydrogen in an amount below explosion limit.

4. The method for producing a bonded wafer according to claim 2, wherein the heat treatment in an atmosphere of an inert gas, hydrogen or a mixed gas thereof is performed in a 100% argon atmosphere or an argon atmosphere containing hydrogen in an amount below explosion limit.

5. The method for producing a bonded wafer according to claim 1, wherein a silicon single crystal wafer is used as the bond wafer.

6. The method for producing a bonded wafer according to claim 2, wherein a silicon single crystal wafer is used as the bond wafer.

7. The method for producing a bonded wafer according to claim 3, wherein a silicon single crystal wafer is used as the bond wafer.

8. The method for producing a bonded wafer according to claim 4, wherein a silicon single crystal wafer is used as the bond wafer.

9. A bonded wafer produced by the method according to claim 1.

10. A bonded wafer produced by the method according to claim 2.

11. A bonded wafer produced by the method according to claim 3.

12. A bonded wafer produced by the method according to claim 4.

13. A bonded wafer produced by the method according to claim 5.

14. A bonded wafer produced by the method according to claim 6.

15. A bonded wafer produced by the method according to claim 7.

16. A bonded wafer produced by the method according to claim 8.

17. A bonded SOI wafer produced by bonding two silicon wafers via an oxide film, wherein surface roughness (RMS) measured for a 1 $\mu$m square and 10 $\mu$m square of an SOI layer surface is 0.15 nm or less for both squares, and $\sigma$ of a thickness of an SOI layer is 1.5 nm or less.

* * * * *